United States Patent
Whetsel

(10) Patent No.: US 6,646,460 B2
(45) Date of Patent: Nov. 11, 2003

(54) PARALLEL SCAN DISTRIBUTORS AND COLLECTORS AND PROCESS OF TESTING INTEGRATED CIRCUITS

(75) Inventor: Lee D. Whetsel, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 131 days.

(21) Appl. No.: 09/997,540

(22) Filed: Nov. 29, 2001

(65) Prior Publication Data

US 2002/0196045 A1 Dec. 26, 2002

Related U.S. Application Data

(62) Division of application No. 09/836,675, filed on Apr. 16, 2001, now Pat. No. 6,362,015, which is a division of application No. 09/183,885, filed on Oct. 30, 1998, now Pat. No. 6,242,269.

(60) Provisional application No. 60/064,145, filed on Nov. 3, 1997.

(51) Int. Cl.[7] .............................................. G01R 31/02
(52) U.S. Cl. ........................................ 324/763; 324/765
(58) Field of Search ................................ 324/763, 765; 257/48; 438/17, 18

*Primary Examiner*—Kamand Cuneo
*Assistant Examiner*—Evan Pert
(74) *Attorney, Agent, or Firm*—Lawrence J. Bassuk; W. James Brady; Frederick J. Telecky, Jr.

(57) ABSTRACT

An integrated circuit (70) having parallel scan paths (824–842, 924–942) includes a pair or pairs of scan distributor (800,900) and scan collector (844,944) circuits. The scan paths apply stimulus test data to functional circuits (702) on the integrated circuit and receive response test data from the functional circuits. A scan distributor circuit (800) receives serial test data from a peripheral bond pad (802) and distributes it to each parallel scan path. A scan collector circuit (844) collects test data from the parallel scan paths and applies it to a peripheral bond pad (866). This enables more parallel scan paths of shorter length to connect to the functional circuits. The scan distributor and collector circuits can be respectively connected in series to provide parallel connections to more parallel scan paths. Additionally multiplexer circuits (886,890) can selectively connect pairs of scan distributor and collector circuits together. The scan distributor and collector circuits can be formed in core circuits (704). The core circuits then can be connected to other core circuits and functional circuits with simple connections to the parallel scan circuits through the scan distributor and collector circuits.

15 Claims, 8 Drawing Sheets

PARALLEL SCAN DISTRIBUTORS AND COLLECTORS AND PROCESS OF TESTING INTEGRATED CIRCUITS

This is a division of Ser. No. 09/836,675, filed Apr. 16, 2001, now U.S. Pat No. 6,362,015 which is a division of Ser. No. 09/183,885, filed Oct. 30, 1998 now U.S. Pat. No. 6,242,269, which claims priority to 60/064,145 filed Nov. 3, 1997.

BACKGROUND OF THE INVENTION

1. Field of the Invention

This invention relates generally to testing of integrated circuits using parallel scan paths and particularly relates to testing those integrated circuits using serial to parallel and parallel to serial registers to move test information to and from the integrated circuit.

2. Description of the Related Art

Cost effective testing of today's complex integrated circuits is extremely important to semiconductor manufacturers from a profit and loss standpoint. The increases in complexity of state-of-the-art integrated circuits is being accompanied by an ever increasing difficulty to test the integrated circuits. New test techniques must be developed to offset this increasing integrated circuit test cost, otherwise further advancements in future integrated circuit technology may be blocked. One emerging technology that is going to accelerate the complexity of integrated circuits even more is intellectual property cores. These cores will provide highly complex pre-designed circuit functions such as; DSPs, CPUs, I/O peripherals, memories, and mixed signal A/D and D/A functions. These cores will exist in a library and can be selected and placed in an integrated circuit to quickly provide a complex circuit function. The low cost testing of integrated circuits that contain highly complex core functions will be a significant challenge

SUMMARY OF THE INVENTION

The present invention provides a way to amplify test data input to and output from an integrated circuit by use of pad resident circuits described as parallel scan distributors, PSDs, and parallel scan collectors, PSCs. The scan distributor circuits amplify the number of parallel serial data inputs to the integrated circuit's functional circuitry, and the scan collector circuits amplify the number of parallel serial data outputs from the integrated circuit's functional circuitry.

Additionally, the invention provides a way to test complex cores or core circuits embedded within integrated circuits by reuse of scan distributor circuits and scan collector circuits located at the I/O terminals of the core. In this aspect of the present invention, core resident scan distributor and collector circuits amplify the test data input to and output from the core circuitry, similar to that described for the integrated circuit having no core circuits.

Further, the invention provides a way concurrently to test core and non-core circuitry within an integrated circuit. In this aspect of the present invention, the scan distributor and collector circuits residing at the bond pads of the integrated circuit are serially linked with scan distributor and collector circuits residing at core I/O terminals to provide massive parallel test data input to and output from circuitry within the integrated circuit.

The invention described below facilitates parallel scan testing by use of the scan distributor and scan collector circuits. The scan distributor circuit is basically a serial-input parallel-output shift register, and the scan collector circuit is basically a parallel-input serial-output shift register. While these distributor and collector circuits can be of any bit length, one embodiment shows the distributor and collector circuits being 10 bits deep. With 10 bit deep distributor and collector circuits, the number of scan paths each pad can access is multiplied by a factor of 10. By amplifying the number of scan paths a pad can access, the functional circuitry of the integrated circuit can be partitioned into many more shorter scan paths, reducing the test time of the integrated circuit by reducing the test data shift in/shift out time. For example, using 10 bit scan distributor and collector circuits, an integrated circuit with 200 bond pads (100 bond pad pairs) available for transferring test data can concurrently access 1000 parallel scan paths.

DETAILED DESCRIPTION

Figure 1:
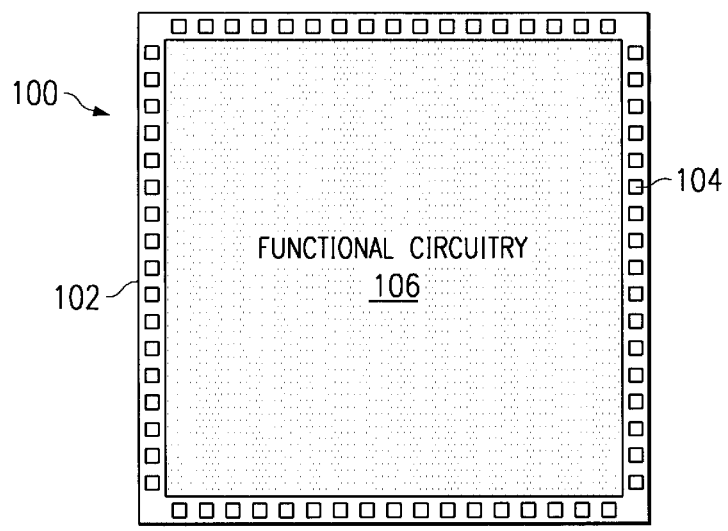
FIG. 1 depicts an integrated circuit.

In FIG. 1, integrated circuit 100 comprises a semiconductor substrate 102 with bond pads 104 and functional circuitry 106. To expedite testing, an integrated circuit's functional circuitry 106 can be arranged into many parallel scan paths, each scan path having a serial data input and serial data output. Having many short parallel scan paths, versus one long continuous scan path, is preferred since it reduces the time it takes to shift test data in and out. Each parallel scan path's serial data input and output can be connected to a bond pad 104 to allow a tester to input test data to and output test data from all scan paths concurrently. Parallel scan design references include FIG. 18-3 of Chapter 18 of 1990 IEEE Publication "The Test Access Port and Boundary Scan Architecture" by Colin Maunder, and FIG. 14a of U.S. Pat. No. 5,526,365 to Whetsel.

Figure 2:
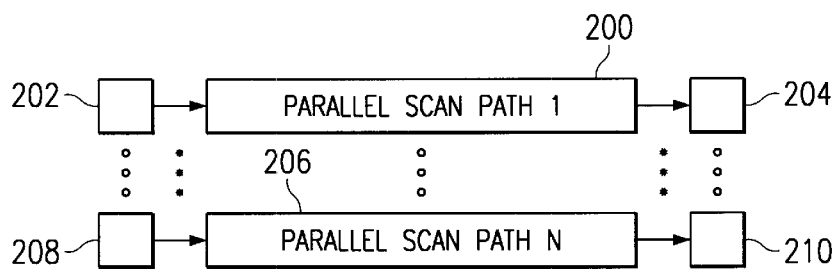
FIG. 2 is a block diagram of a known parallel scan path test arrangement.

In FIG. 2, known parallel scan path 200 has a serial data input at pad 202 and a serial data output at pad 204. Known parallel scan path N 206 has a serial data input at pad 208 and a serial data output at pad 210. In the circuits of FIG. 2, N scan paths will require use of 2×N bond pads for serial data input and serial data output. While some bond pads will be used to supply control to the scan paths and for power and ground, a majority of the bond pads may be used for scan path serial data input and output. The number of available bond pad pairs will limit the number of scan paths that can be accessed in parallel.

The scan cycle time of the conventional scan path arrangement of FIG. 2 can be expressed by (L+1)T, where L is the scan path length through which stimulus and response test patterns are shifted during each scan cycle, 1 is the capture step required to input response data from the functional logic under test into the scan path, and T is the period of the scan clock. Using this equation, for example, the scan cycle time for a scan path having a length (L) of 1000 bits is (1000+1)T, or 1001T. The test time equals "scan cycle time" times "the number of test patterns".

Figure 3:
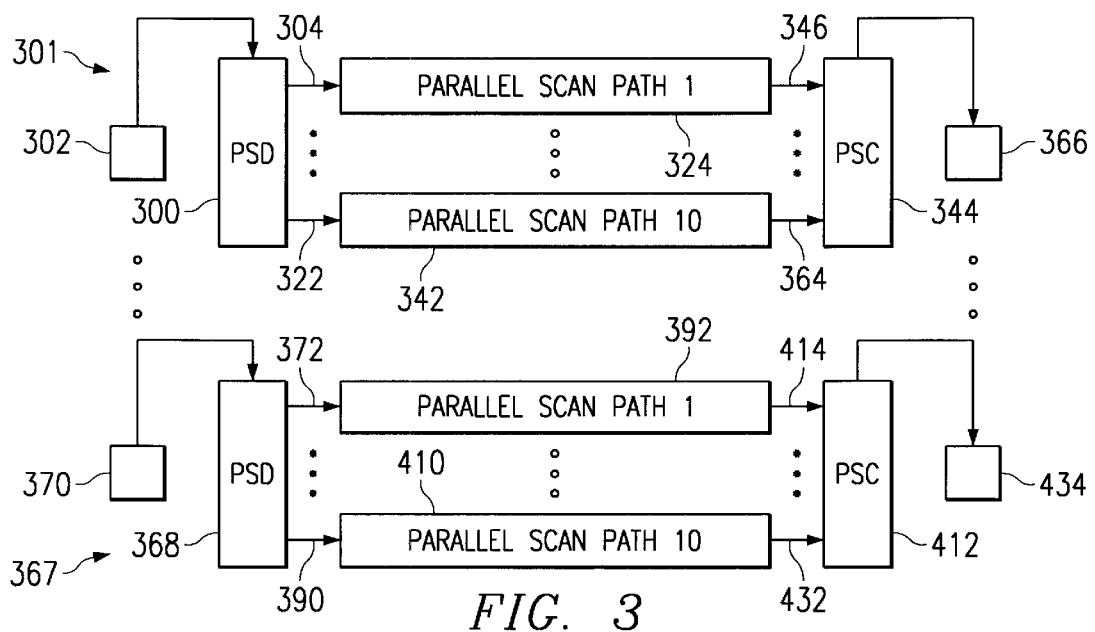
FIG. 3 is a block diagram of a parallel scan path test arrangement according to the present invention.

In FIG. 3, scan test circuit 301 includes a scan distributor 300, scan paths 324 through 342 and scan collector 344. Parallel scan distributor circuit 300 forms a data input amplification circuit connected between bond pad 302 and data inputs 304 through 322 to ten plural scan paths 324 through 342, of which only the first and last are depicted for clarity of the drawing. Parallel scan collector circuit 344 forms an output amplification circuit connected between the data outputs 346 through 364 of plural scan paths 324 through 342 and bond pad 366.

Scan test circuit 367 includes a scan distributor 368, scan paths 392 through 410 and scan collector 412. In a like manner, parallel scan distributor circuit 368 forms a data input amplification circuit connected between bond pad 370 and data inputs 372 through 390 to ten plural scan paths 392 through 410, of which only the first and last are depicted for clarity of the drawing. Parallel scan collector circuit 412 forms an output amplification circuit connected between the data outputs 414 through 432 of plural scan paths 392 through 410 and bond pad 434.

Scan paths 324 through 342 form one group of scan paths connected between scan distributor circuit 300 and scan collector circuit 344. Scan paths 392 through 410 form another group of scan paths connected between scan distributor circuit 368 and scan collector circuit 412.

In FIG. 3, the parallel scan distributor provides a data input amplification circuit located between a bond pad and data inputs to plural scan paths. The parallel scan collector provides a data output amplification circuit located between the data outputs of the plural scan paths and a bond pad. This is different from the conventional parallel scan path arrangement depicted in FIG. 2 in which each scan path's data input is directly connected to a bond pad and each scan path's data output is directly connected to a bond pad. Therefore, the data amplification capability of the present invention is understood by comparing FIG. 2 and FIG. 3.

The conventional parallel scan path arrangement of FIG. 2 thus is modified by the insertion of parallel scan distributor circuits and parallel scan collector circuits. The scan distributor circuits 300, 368 are basically serial-input parallel-output shift registers, and the scan collector circuits 344, 434 are basically parallel-input serial-output shift registers. While the parallel input and output width of the scan distributor and collector circuits can be of any bit width, the distributor and collector circuits 300, 344, 368 and 412 have 10 bit wide parallel inputs and outputs that provide one bit input and output to the respective parallel scan paths.

The scan input modifications of the FIG. 2 arrangement include: (1) disconnecting the bond pads from scan paths 1–N, (2) inserting the scan distributor circuits, (3) connecting the bond pads to the serial inputs of the scan distributor circuits, and (4) connecting each parallel output of the scan distributor circuits to a respective input of the scan paths. The scan output modifications of the FIG. 2 arrangement include: (1) disconnecting the bond pads from scan paths 1–N, (2) inserting the scan collector circuits, (3) connecting the bond pads to the serial outputs of the scan collector circuits, and (4) connecting the output of each scan path to a respective parallel input of the scan collector circuits.

The scan path modifications of the FIG. 2 arrangement include: (1) dividing each scan path 1–N into a group of individual shorter length scan paths, each preferably being of equal length, and in which the number of individual scan paths of each group equals to the number of parallel inputs and outputs (10) of the scan distributor and scan collector circuits, (2) connecting the serial data input of each scan path of each group to a parallel output of a respective scan distributor circuit, and (3) connecting the serial data output of each scan path of each group to a parallel input of a respective scan collector circuit.

With 10 bit deep scan distributor and collector circuits, the number of individual scan paths in each group is equal to ten. If the scan paths 200 and 206 of FIG. 2 were each 1000 bits long, the above partitioning would convert each 1000 bit scan path into a group of ten 100 bit scan paths.

Figure 4:
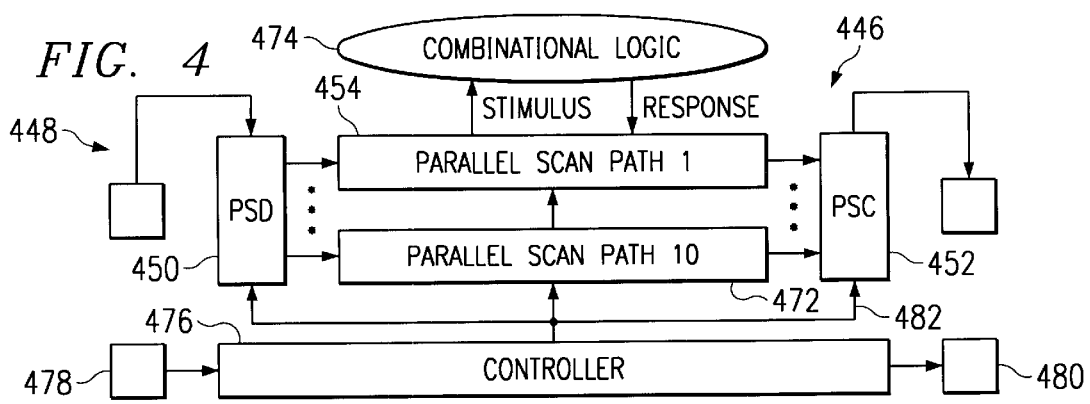
FIG. 4 is a block diagram of the scan path test arrangement of FIG. 3 further including a test controller according to the present invention.

In FIG. 4, integrated circuit 446 includes scan test circuits 448. One scan distributor 450 and scan collector 452 pair provide access to 10 parallel scan paths 454 through 472. Each of the 10 parallel scan paths connects to combinational logic 474 in functional circuitry 106. The combinational logic 474 is tested by inputting test stimulus and outputting test response through the parallel scan paths 454 through 472. While stimulus input and response output connections are shown only between combinational logic 474 and parallel scan path 1 454, all ten of the parallel scan paths 454 through 472, respectively, are similarly connected to combinational logic 474.

A controller 476 connects to the scan distributor circuit 450, parallel scan paths 1–10 454 through 472 and scan collector 452, as well as all other scan distributors, parallel scan paths, and scan collectors in the integrated circuit by leads 482. Controller 476 controls the test operation of the scan distributor circuits, parallel scan paths 1–10 454 through 472 and scan collector 452, as well as all other scan distributors, parallel scan paths, and scan collectors in the integrated circuit. The controller 476 connects to bond pads 478 and 480 for access and control by a source external to the integrated circuit, such as a wafer or integrated circuit tester.

When the integrated circuit's functional circuitry is configured for testing, all functional registers (flip/flops or latches) in the integrated circuit are converted into scan registers that form the parallel scan paths shown. Also, during test configuration, all combinational logic in the integrated circuit that was associated with the functional registers remains associated with the scan registers after the conversion. This conversion of an integrated circuit's functional circuitry into scan paths and combinational logic is well known.

The combinational logic 474 is tested by receiving test stimulus data from the parallel scan paths 454 through 472 and outputting test response data to the parallel scan paths 454 through 472. The test stimulus data applied to the combinational logic 474 from the parallel scan paths is input to the parallel scan paths via the scan distributor 450. The test response data received into the parallel scan paths from the combinational logic is output from the parallel scan paths via the scan collector 452. During test, the controller 476 operates the scan distributor 450, parallel scan paths 454–472, and scan collector 452 to test the combinational logic 474. Simultaneous with this test, the controller 476 also operates other scan distributors, parallel scan paths, and scan collectors of the integrated circuit to test further combinational logic within the integrated circuit.

Figure 5:
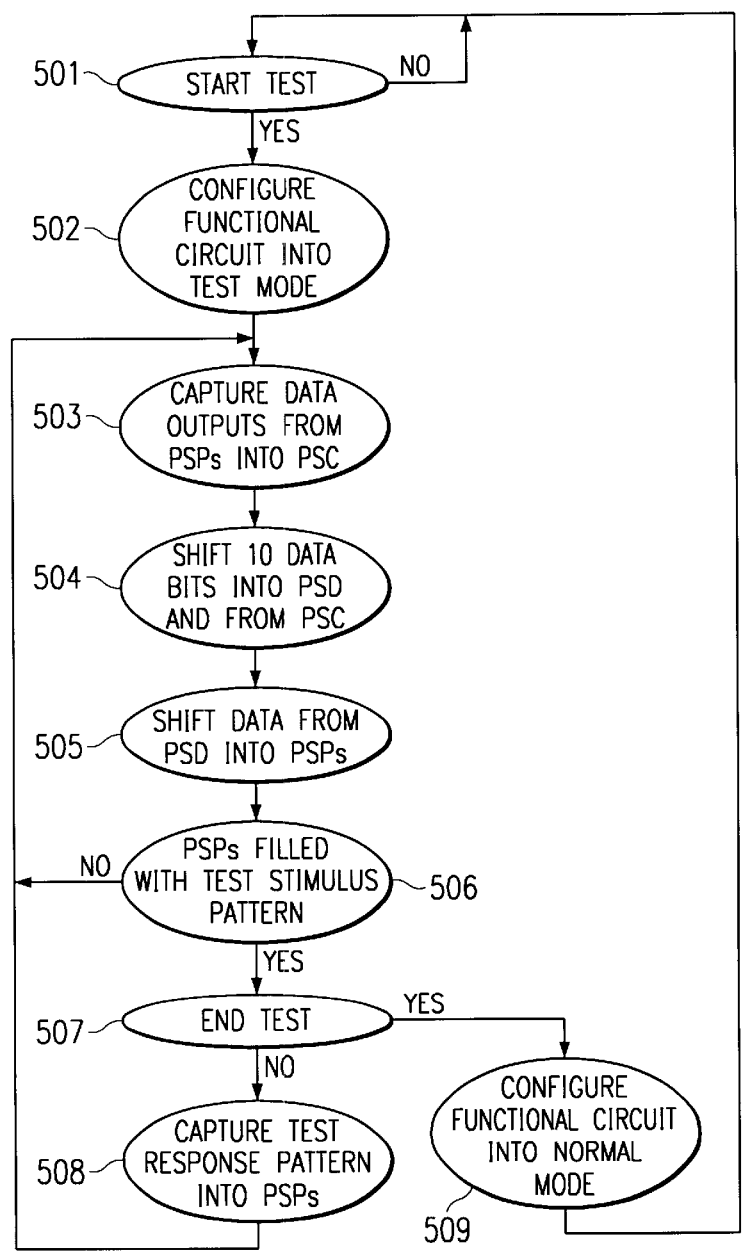
FIG. 5 is a flow chart illustrating operation of the test controller and scan path arrangement of FIG. 4.

In FIG. 5, the flow chart illustrates one example of the controller operating the scan distributor, parallel scan paths, and scan collector of FIG. 4 during testing of the integrated circuit's combinational logic. Initially, the controller will be in the start test state waiting for a signal to start testing. In response to a start test signal, the controller executes the following steps. The step numbers correspond to the state numbers in the diagram of FIG. 5.

| Step Number | Operation |
|---|---|
| 501 | Test to see if start test has occurred. No, goto 501. Yes, goto 502. |
| 502 | Configure functional circuitry into test mode, goto 503 |
| 503 | Capture response data outputs from all parallel scan paths (PSPs) into scan collector (PSC), goto 504 |
| 504 | Shift scan distributor and collector ten times to load stimulus data into distributor and unload response data from collector, goto 505 |
| 505 | Shift scan paths one time to load scan paths with test stimulus data from scan distributor, goto 506 |
| 506 | Test to see if parallel scan paths (PSPs) have filled with the test stimulus pattern No, goto 503 Yes, goto 507 |
| 507 | Test to see if end of test has occurred No, goto 503 Yes, goto 509 |
| 508 | Capture response pattern from combinational logic into parallel scan paths (PSPs), goto 503 |
| 509 | End of test, configure IC circuitry into normal mode, goto 501 |

Following the end of test step 507, the test is complete and the controller configures the functional circuitry back into its normal mode, then goes to and remains in the start test state 501 until another start test signal occurs. During the test, a tester supplies stimulus data to the scan paths via the serial to parallel operation of the scan distributors, and receives response data from the scan paths via the parallel to serial operation of the scan collectors. The tester compares the response data it receives from the scan collectors to expected response data to determine if the test passes or fails. Alternately, during the test the tester may compress the response data it receives from the scan collectors into signatures and then compare the signatures at the end of test to expected signatures.

Figure 6:
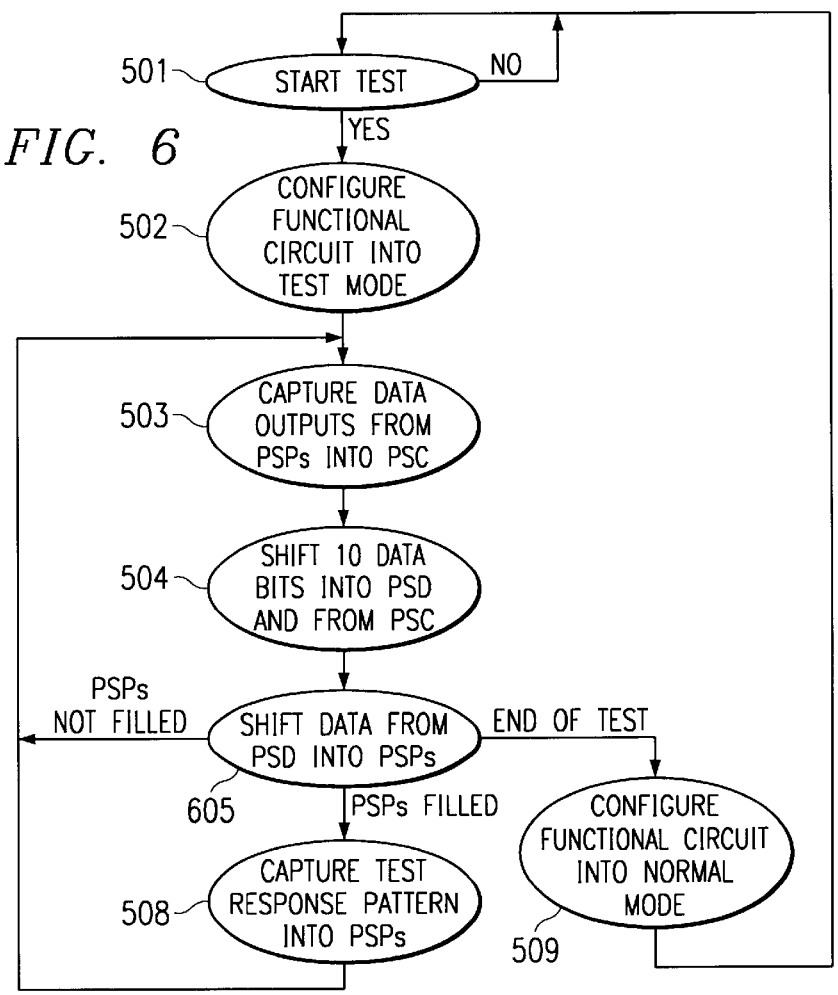
FIG. 6 is a flow chart illustrating an alternate operation of the test controller and scan path arrangement.

In FIG. 6, an example of another controller flow chart illustrates how the decision states 506 and 507 of FIG. 5 may be merged into state 605 of FIG. 6 to streamline the test execution flow. In FIG. 6, state 605 executes the shift operation that moves data from the scan distributors into the scan paths, then executes decision states to determine whether the next state will be state 503, 508, or 509. Merging the decision states into state 605 is possible because the decisions regarding the full/not full status of the scan paths and the end of test are easily predictable conditions.

| Step Number | Operation |
|---|---|
| 501 | Test to see if start test has occurred No, goto 501 Yes, goto 502 |
| 502 | Configure IC circuitry into test mode, goto 503 |
| 503 | Capture response data outputs from all parallel scan paths into scan collectors, goto 504 |
| 504 | Shift scan distributors & scan collectors ten times to load stimulus data into scan distributors and unload response data from scan collectors, goto 605 |
| 605 | Shift scan paths one time to load scan paths with test stimulus data from scan distributors, then If scan path is not filled, goto 503 If scan path is filled & not end of test, goto 508 If scan path is filled & end of test goto 509 |
| 508 | Capture response pattern from combinational logic into scan paths, goto 503 |
| 509 | Configure IC circuitry into normal mode, goto 501 |

While the test data input and output bandwidth of the scan paths 454 through 472 is reduced by the serial to parallel translation in scan distributor 450 and parallel to serial translation in scan collector 452 that occurs for each datum shifted into and out of the parallel scan paths. The overall test time however is comparable to the conventional parallel scan test times for the circuits of FIG. 2. The reason for this is that scan distributor and scan collector circuits enable test data to be communicated to a larger number of shorter length parallel scan paths, whereas the conventional parallel scan arrangement of FIG. 2 communicates test data to a lesser number of longer length scan paths.

The scan cycle time of the scan distributor and scan collector arrangement of FIG. 4, using the FIG. 6 controller operation steps, can be expressed by equation $((D+2)L+1)T$, where: $(D+2)$ is the scan depth (D) of the scan distributor and scan collector circuits shifted, step 504; plus 2, the shifting of data between scan distributor and scan paths in step 605, and between scan collector and scan paths in step 503; L is the scan path length through which data is shifted during each scan cycle; plus 1, the capture step 508 required to input data from the combinational logic into the scan paths; and T is the period of the scan clock.

For the purpose of illustrating a comparison of the scan cycle times between the conventional path arrangement of FIG. 2 and the scan distributor and scan collector scan path arrangement of FIG. 4, the L in the scan distributor and scan collector scan cycle time equation above can be expressed in terms of the L in the conventional scan cycle time equation. As previously described in regard to FIG. 3, a conventional scan path having a length (L) can be converted into a group of ten individual scan paths each having a length of L/10, when using 10 bit scan distributor and scan collector circuits. Converting the original conventional scan path of FIG. 2 into an equivalent scan distributor and scan collector scan path arrangement does not modify the stimulus and response connections to the combinational logic, it simply partitions the single conventional scan path into an equivalent group of shorter length scan paths. Therefore, for the purpose of comparing scan cycle times between the conventional scan path arrangement of FIG. 2 and a converted, but equivalent, stimulus and response connection, scan distributor and scan collector scan path arrangement of FIG. 4, L/10 is substituted for L in the scan distributor and scan collector scan cycle time equation above.

This results in a scan distributor and scan collector scan cycle time equation of: $((D+2)(L/10)+1)T$, or $((10+2)(L/10)+1)T$, or $(1.2L+1)T$, where: L equals the bit length of the original scan path of FIG. 2, and D equals the depth (i.e. 10 bits) of the scan distributor and scan collector circuits. Substituting L=1000 into the conventional scan path equation, $(L+1)T$, of FIG. 2 and scan distributor and scan collector equation, $(1.2L+1)T$, above, results in 1001T and 1201T, respectively. In comparing 1001T to 1201T, it is seen that the conversion of the conventional scan path arrangement into an equivalent scan distributor and scan collector scan path arrangement only extends the scan cycle time by approximately 16.6%, in this example.

The scan distributor and scan collector scan cycle time advantageously approaches the conventional scan test time as the depth of the scan distributor and scan collector circuits increase, since test data may be communicated to a larger number of shorter length parallel scan paths. For example, with 40 bit deep scan distributor and scan collector circuits connected to forty 25 bit scan paths, converted from the FIG. 2 scan path as described above, the scan distributor and scan collector scan cycle time becomes $(40+2)(L/40)+1)T$, or $(1.05L+1)T$, which extends the scan cycle time by approximately 4.7% compared to the conventional scan cycle time. For identical combinational logic being tested, the number of scan cycles required to apply the test patterns is the same for both the scan distributor and scan collector and conventional scan path arrangements. The integrated circuit test time will therefore be extended in proportion to the scan cycle time extension.

Figure 7:
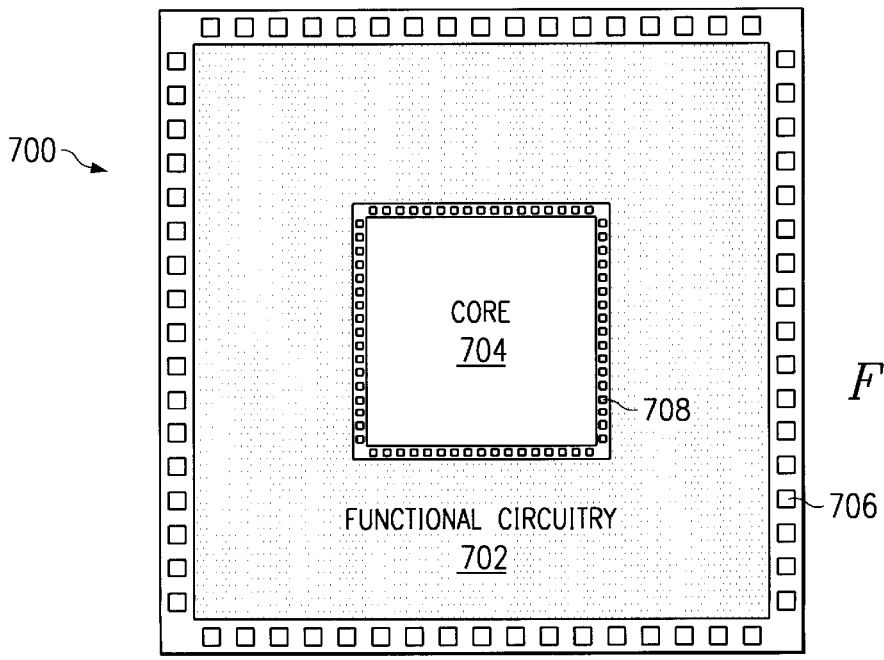
FIG. 7 depicts an integrated circuit that includes an embedded core.

In FIG. 7, an IC 700 contains within its functional circuitry 702 a complex core circuit 704, such a DSP. The IC's functional circuit 702 contains other circuits besides the core. IC 700 includes peripheral bond pads 706 and core circuit 704 includes its own set of peripheral terminals 708. In this example, both the IC 700 and core 704 have been designed to include the previously described invention comprising scan distributor and scan collector circuits, parallel scan paths, and the controller 476.

Figure 8:
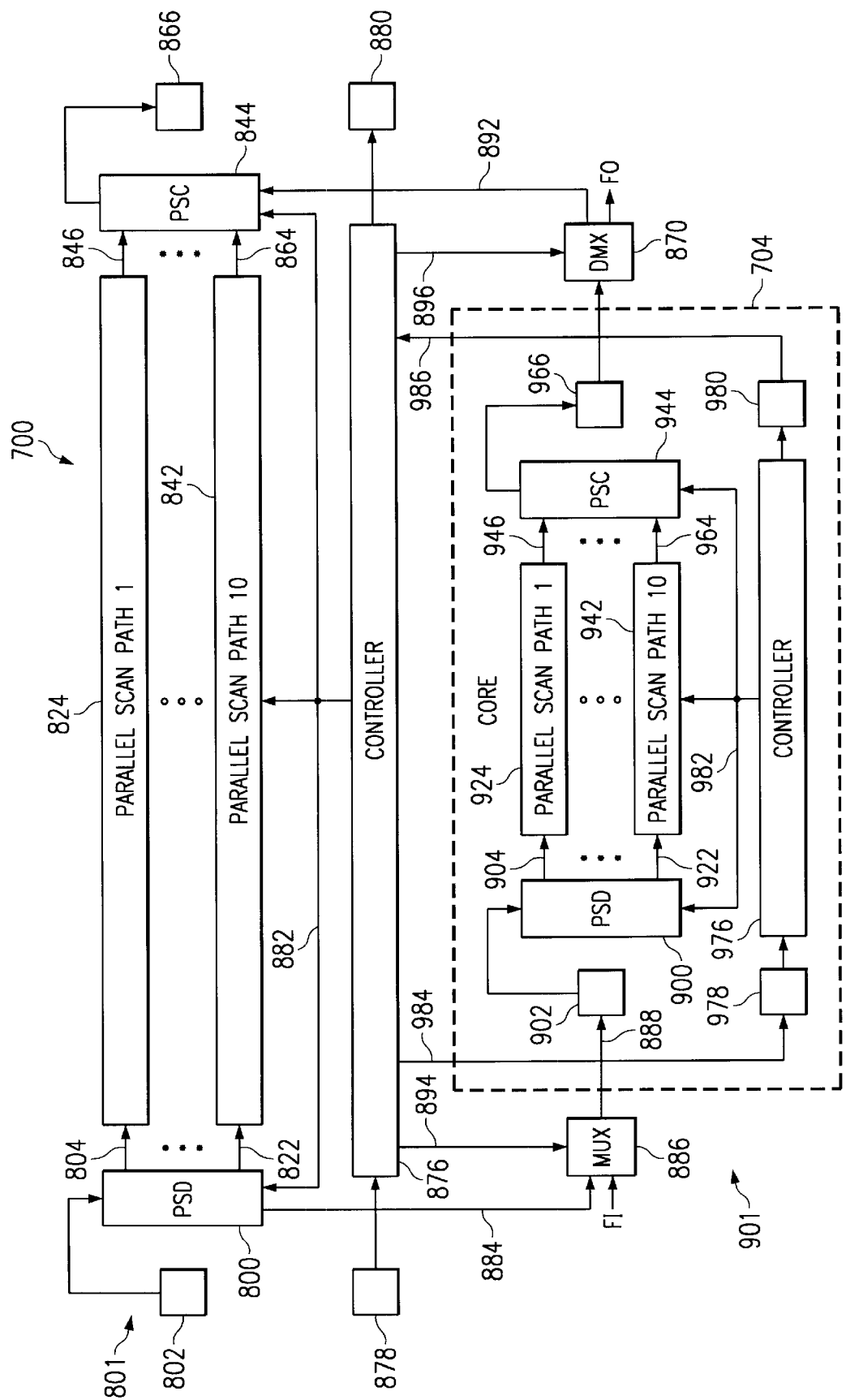
FIG. 8 is a block diagram of a scan test circuit and controller arrangement for testing the integrated circuit and core of FIG. 7 according to the present invention.

In FIG. 8, the IC 700 includes functional circuit and core circuit scan distributor and scan collector architectures. The view is simplified in that it depicts only one exemplary pair of scan distributor and scan collector circuits for each of the functional and core circuits.

In FIG. 8, functional scan test circuits 801 associate with functional circuits 702. Parallel scan distributor circuit 800 forms a data input amplification circuit connected between bond pad 802 and data inputs 804 through 822 to ten plural scan paths 824 through 842, of which only the first and last are depicted for clarity of the drawing. Parallel scan collector circuit 844 forms an output amplification circuit connected between the data outputs 846 through 864 of plural scan paths 824 through 842 and bond pad 866. Bond pads 802 and 866 are part of peripheral bond pads 706 of the functional circuits 702.

A controller 876 connects to the scan distributor circuit 800, parallel scan paths 1–10 824 through 842 and scan collector 844, by leads 882. Controller 876 controls the test operation of the scan distributor circuit 800, parallel scan paths 1–10 824 through 842 and scan collector 844. The controller 876 connects to bond pads 878 and 880 for access and control by a source external to the integrated circuit 700, such as a wafer or integrated circuit tester. Bond pads 878 and 880 are part of peripheral bond pads 706.

In core circuits 704, core scan test circuits 901 associate with core circuits 704. Parallel scan distributor circuit 900 forms a data input amplification circuit connected between terminal 902 and data inputs 904 through 922 to ten plural scan paths 924 through 942, of which only the first and last are depicted for clarity of the drawing. Parallel scan collector circuit 944 forms an output amplification circuit connected between the data outputs 946 through 964 of plural scan paths 924 through 942 and terminal 966. Terminals 902 and 966 are part of core circuit terminals 708 of the core circuits 704.

A controller 976 connects to the scan distributor circuit 900, parallel scan paths 1–10 924 through 942 and scan collector 944, by leads 982. Controller 976 controls the test operation of the scan distributor circuit 900, parallel scan paths 1–10 924 through 942 and scan collector 944. The controller 976 connects to terminals 978 and 980 for access and control by controller 876 over leads 984 and 986. Terminals 978 and 980 are part of core circuit terminals 708.

Scan distributor 800 has a serial output on lead 884 connecting to one input of multiplexer 886. The other input of multiplexer 886 receives a signal FI. The sole output of multiplexer 886 connects on lead 888 to terminal 902. Terminal 966 connects to the sole input of demultiplexer 890. One output of demultiplexer 890 on lead 892 connects to a serial input of scan collector 844. The other output of demultiplexer 890 connects to a signal FO. Controller 876 connects to the multiplexer 886 on lead 894 and connects to the demultiplexer 890 on lead 896.

In the IC 700, the scan distributor 800 and scan collector 844 circuits are associated with the I/O bond pads for the integrated circuit 700. In the core 704, the scan distributor 900 and scan collector 944 circuits are associated with the I/O terminals for the core circuits 704. The scan distributor 800 and scan collector 844 circuits are the same as described in regard to FIG. 4, except that the scan distributor circuit 800 has been provided with a serial output 884 and the scan collector 844 circuit has been provide with a serial input 892. The core's scan distributor 900 and scan collector 944 circuits are the same as scan distributor 800 and scan collector 844 circuits with two exceptions: they are associated with the core's terminals 902 and 966 and they have no serial output 884 or serial input 892.

A multiplexer 886, or other type of connection circuit is provided at each core terminal that has a scan distributor, and a demultiplexer 890, or other type of connection circuit, is provided at each core terminal that has a scan collector. The multiplexer allows inputting either a functional input signal or test input to the core terminal. The demultiplexer allows outputting either a functional output signal or test output from the core terminal.

The test input to the multiplexer 886 comes from the serial output of the IC's scan distributor circuit 800, and the test output from the demultiplexer 890 goes to the serial input of the IC's scan collector circuit 844. The functional input and output, FI and FO, are connected to neighboring circuits within the IC. During normal mode, the IC's controller 876 controls the multiplexers and demultiplexers at the core terminals to input and output the functional signals. In test mode, the controller 876 controls the multiplexers and demultiplexers to input and output test signals.

Controller 976 is not directly connected to the peripheral bond pads 878 and 880 as is controller 876. Rather, controller 976 for the core circuits is connected indirectly to the peripheral bond pads via the controller 876. Controller 876 has authority over the core's controller 976 in that controller 876 can enable, disable or modify the operation modes of controller 976. However, during test the controllers may operate together to synchronize the operation of the scan distributor and scan collector circuits of the IC and core.

As will be seen in embodiments to be described, this controller interconnect technique is maintained between controllers that are arranged hierarchically within an integrated circuit. Also, the authority of a higher level controller over a lower level controller is maintained in controllers arranged within a hierarchy. Further maintained is the ability of hierarchical controllers to synchronize themselves during test so that the operation of all hierarchically linked scan distributor and scan collector circuits, associated with the controllers, occur synchronously.

Testing, using the IC and core scan distributor and scan collector circuits of FIG. 8, is the same as previously described for the circuits of FIG. 4 with two exceptions. The serial data input to the core's scan distributor circuit 900 passes through the IC's scan distributor circuit 800 and the serial data output from the core's scan collector circuit 944 passes through the IC's scan collector circuit 844. Three types of testing can occur on the IC 700: (1) testing of the IC's functional non-core circuitry, (2) testing of the core circuitry, and (3) simultaneous testing of both the IC's non-core circuitry and the core circuitry.

When the IC's non-core circuitry is being tested, but the core is not being tested, the core's controller 976 is disabled by the IC's controller 876 and the multiplexer 886 and demultiplexer 890 disconnect the core's terminals from inputting or outputting functional signals to neighboring IC circuitry. In this mode the core is quiet and its I/O is disabled from disturbing testing being performed on the non-core circuitry.

When the core is being tested, but the non-core circuitry is not being tested, the core's controller 976 is enabled by the IC's controller 876. The IC's controller 876 controls the core terminal multiplexer 886 and demultiplexer 890 such that the serial data output from the IC's scan distributor circuit 800 is input to the core's scan distributor circuit 900, and the serial data output from the core's scan collector circuit 944 is input to the IC's scan collector circuit 944. Further, the IC controller 876 disables the non-core scan paths from shifting and capturing data and causes the scan distributor 800 and scan collector circuits 844 to operate as test data pipeline registers between the IC pads 802 and 866 and the core's scan distributor 900 and scan collector 944. During test, the core's scan distributor 900 and scan collector 944 circuits are controlled by the core's controller 976 to operate as described in regard to FIGS. 5 or 6. The only difference is that the depth of the scan data input to and output from the core's scan distributor 900 and scan collector 944 circuits is greater since the data is pipelined though the IC's scan distributor 800 and scan collector 844 circuits.

When both the IC's non-core and core circuitry are being tested, both the IC and core controllers 876 and 976 are enabled. Also the core terminal multiplexer 886 and demultiplexer 890 are set to input test data to the core's scan distributor 900 from the IC's scan distributor 800, and to output test data from the core's scan collector 944 to the IC's scan collector 844. During test, both controllers 876 and 976 are synchronized to the external control input from the tester via the peripheral bond pads to allow stimulus data to be scanned into both the IC and core scan distributor circuits while response data is scanned out from both the IC and core scan collector circuits.

The test operation of the IC and core scan distributor and scan collector circuits is identical to that previously described in regard to FIGS. 5 or 6. Again, the only difference is that the depth of the scan data input and scan data output is greater since the IC and core scan distributor and scan collector circuits are serially connected. The advantage of testing both the IC's non-core and core circuitry at the same time is that it reduces the test time of the IC.

These three modes of testing can be setup by scanning the IC and core controllers. Referring to FIG. 8, the IC controller is connected to IC pads for input and output and the core controller is connected to the IC controller for input and output. A tester that is connected to the IC controller input/output bond pads 706 can scan the controllers to set up the type of test to be performed. After setting up the test type, the tester can input control on input pads to cause the controllers to operate according to the way the controllers have been set up. While the IC 700 has one core, other integrated circuits may contain multiple cores. Multiple cores can be tested either individually or in combination with other cores and non-core circuits.

Figure 9:
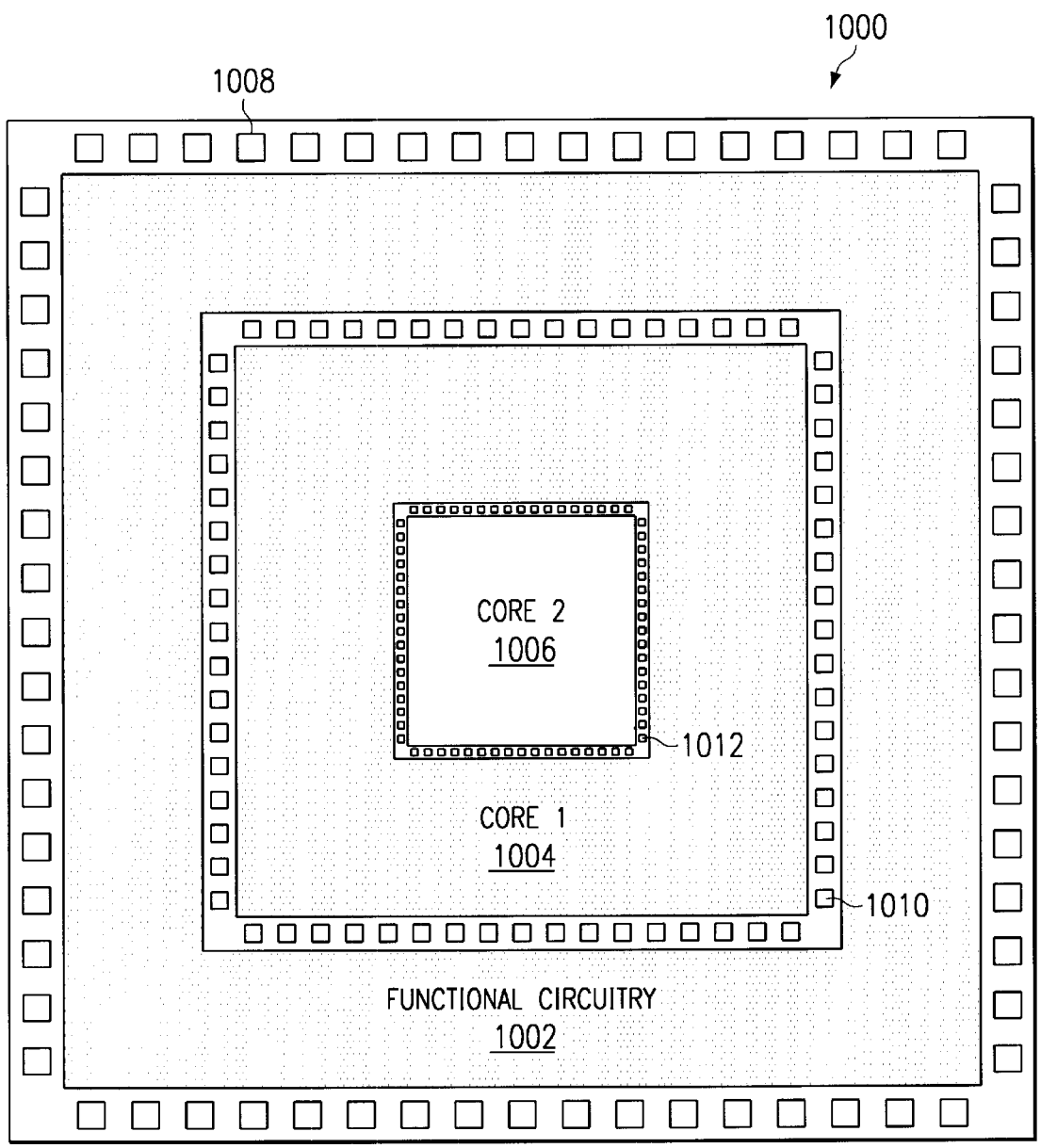
FIG. 9 depicts an integrated circuit including an embedded core, in which the embedded core itself includes an embedded core.

In FIG. 9, integrated circuit 1000 contains functional circuitry 1002, which contains first core circuitry 1004. First core circuitry 1004 contains second core circuitry 1006. This hierarchical embedding of core circuitry or cores within cores creates a very difficult testing situation. The present invention however renders such nesting of cores testable regardless of how deeply embedded they might be within an integrated circuit.

Functional circuitry 1002 is associated with bond pads 1008. First core circuitry is associated with terminals 1010. Second core circuitry is associated with terminals 1012.

Figure 10:
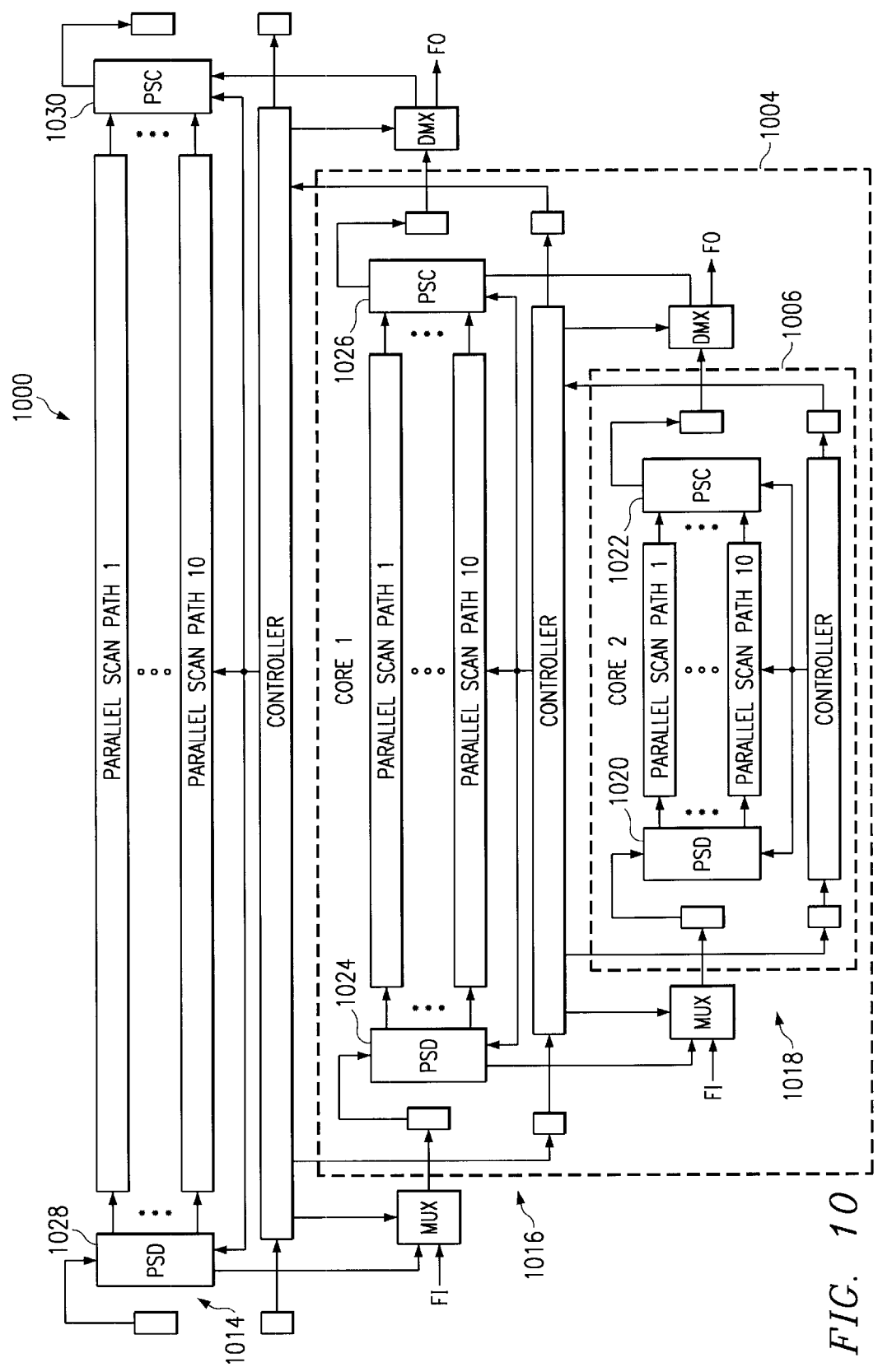
FIG. 10 is a block diagram of a scan test circuit and controller arrangement for testing the integrated circuit and embedded cores of FIG. 9 according to the present invention.

In FIG. 10, the scan distributor and scan collector architecture is shown hierarchically extending from the IC level to the first core level, and from the first core level into the second core level. Integrated circuit 1000 comprises functional scan test circuits 1014 associated with functional circuitry 1002, first scan test circuits 1016 associated with first core circuits 1004 and second scan test circuits 1018 associated with second core circuits 1006.

In accordance with the circuits depicted in FIGS. 7 and 8, test access to the second scan test circuits 1018 is achieved through the serial pipelines provided by the first scan test circuits 1016 and functional scan test circuits 1014. Thus the scan distributor 1020 and scan collector 1022 circuits of second core circuits 1006 is achieved via the serial pipelines provided by the scan distributor and scan collector circuits 1024 and 1026 of first scan test circuits 1016 and the scan distributor and scan collector circuits 1028 and 1030 of the functional scan test circuits 1014.

Also as described in regard to FIG. 8, all the functional circuits 1002, first core circuits 1004 and second core circuits 1006 can be tested together, in selected combinations, or individually. When testing all of the IC's circuitry together, the scan distributor and scan collector circuits and controllers are set up to allow the tester to input deep stimulus patterns to serially connected scan distributors and to output deep response patterns from serially connected scan collectors. The test is the same as described in connection with FIG. 8, only the depth of the serial stimulus and response patterns changes as more scan distributor and scan collector circuits are added to the IC's bond pad input and output scan operations.

Figure 11:
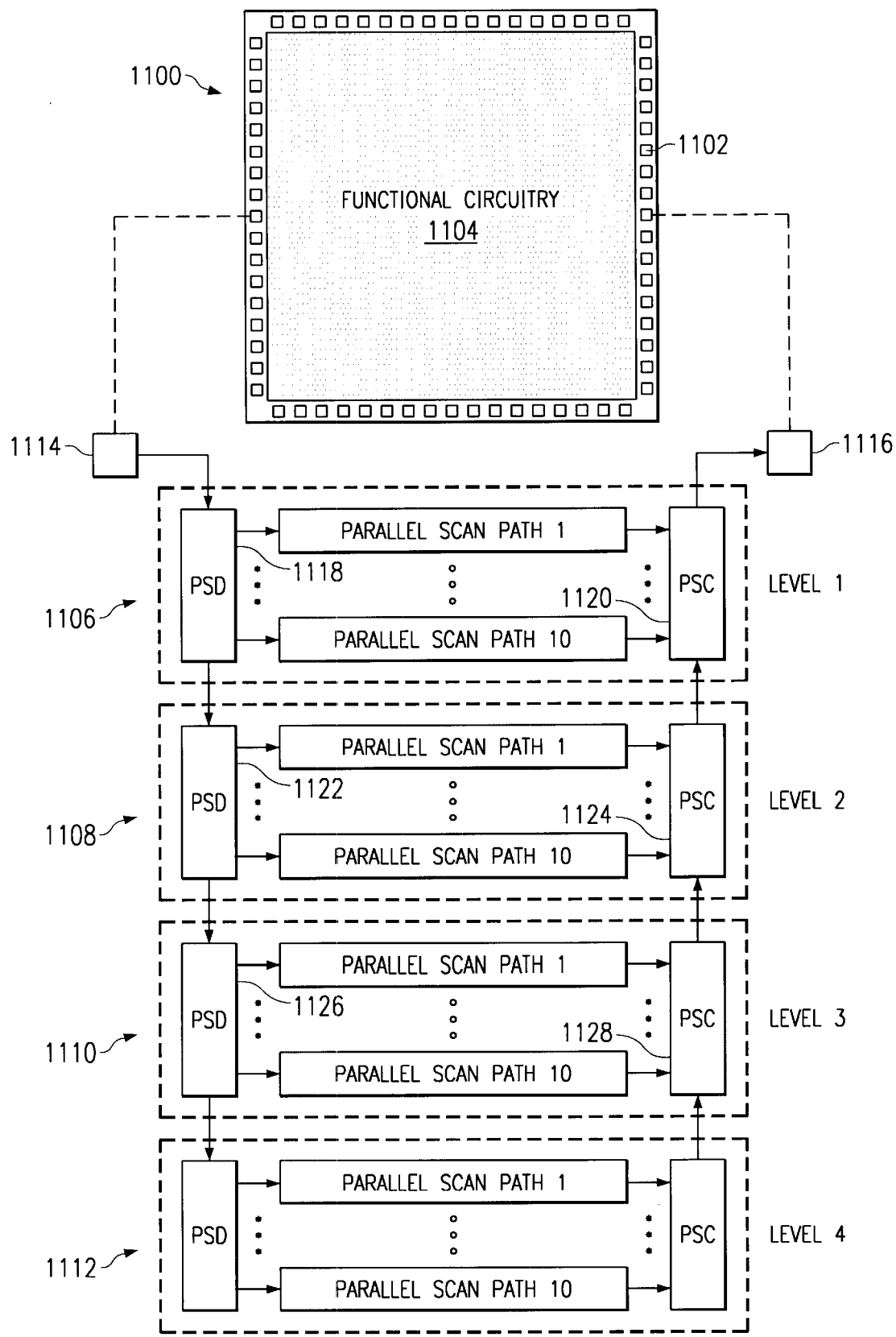
FIG. 11 is a block diagram of a hierarchical connection between scan test circuit arrangements according to the present invention.

In FIG. 11, integrated circuit 1100 includes peripheral bond pads 1102, functional circuits 1104 and scan test circuits 1106, 1108, 1110 and 1112. Scan test circuits 1106, 1108, 1110 and 1112 are connected in series to each of bond pads 1114 and 1116.

The scan test circuits 1106, 1108, 1110 and 1112 illustrate a simplified view of how scan distributor and scan collector circuits can be used hierarchically within an IC to bring about massive parallel scan testing. Each available pair of IC bond pads can be viewed as entry and exit points to a hierarchical arrangement of embedded scan distributor and scan collector circuits. Each scan distributor and scan collector circuit can be serially linked to the bond pads, either directly, as with the scan distributor and scan collector circuits 1118 and 1120, or via intermediate scan distributor and scan collector circuits, such as scan distributor and scan collector circuits 1122 and 1124, or 1126 and 1128.

In FIG. 11, 4 levels of 10 bit scan distributor and scan collector circuits are linked to the bond pad pair 1114, 1116 to provide a 40 bit wide test data input and output interface using only two of the IC bond pads. Each level could represent the hierarchical position of an embedded core within the IC. While not shown, all available pad pairs (i.e. pads not used for test control or power/ground) can be similarly connected in a hierarchical arrangement to 40 bit wide scan distributor and scan collector circuits inside the IC. A tester connected to the pad pairs can transfer test data to the target test circuits residing in the IC at each hierarchical circuit level 1–4. The serial to parallel and parallel to serial test data operation of hierarchically arranged scan distributors and scan collectors is clear from FIG. 11.

Figure 12:
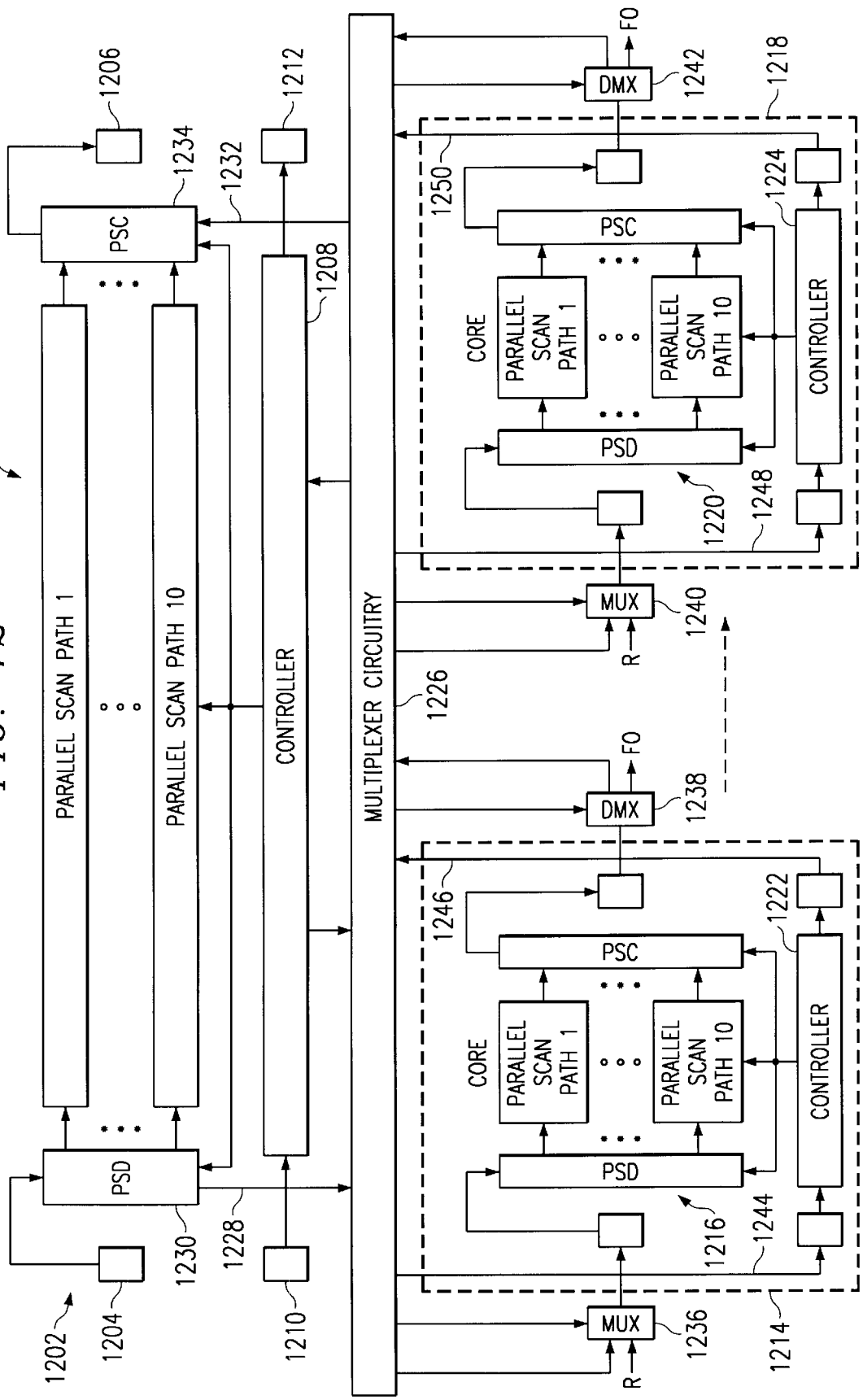
FIG. 12 is a block diagram of an arrangement of scan test circuits and controllers using multiplexer circuitry according to the present invention.

In FIG. 12, integrated circuit 1200 includes scan test circuits 1202 connected to bond pads 1204 and 1206. Controller 1208 connects to bond pads 1210 and 1212 and scan test circuits 1202. Integrated circuit 1200 also includes core circuits 1214 that include scan test circuits 1216 and core circuits 1218 that include scan test circuits 1220. Controller 1222 is associated with scan test circuits 1216 and controller 1224 is associated with scan test circuits 1220.

Multiplexer circuitry 1226 connects scan test circuits 1202 to scan test circuits 1216 and 1220. A serial output 1228 of scan distributor 1230 connects to the multiplexer 1226 and a serial input 1232 of scan collector 1234 connects to multiplexer 1226. Scan test circuits 1216 connect to multiplexer 1226 through multiplexer 1236, which also receives a functional input FI, and through demultiplexer 1238, which also provides a functional output FO. Scan test circuits 1220 connect to multiplexer 1226 through multiplexer 1240, which also receives a functional input FI, and through demultiplexer 1242, which also provides a functional output FO. Controllers 1222 and 1224 also connect to multiplexer 1226 through respective leads 1244, 1246, 1248 and 1250.

Integrated circuit 1200 provides an alternate configuration for using scan distributor and scan collector circuits whereby cores 1214 and 1218 are individually selected and connected to the IC's scan distributor and scan collector circuitry and controller for testing. This selection is achieved by placing multiplexer circuitry 1226 between the IC's scan distributor 1230, scan collector 1234, and controller 1208 circuitry, and the cores. Thus the cores 1214 and 1218 can be individually connected to the serial data input and output of the IC's scan distributor and scan collector circuitry and to the IC's controller. The IC's controller supplies the control input to the multiplexer circuitry for selecting a core for testing. Once a core is selected and connected to the IC's scan distributor and scan collector circuitry, the core is tested as previously described.

It is important to note that when the integrated circuits 446, 700, 1000, 1100 or 1200 evolve into a core for use inside another integrated circuit, their hierarchical scan distributor and scan collector test architectures are reusable inside that IC. The ability to reuse the test architecture, as well as the test patterns developed for the architecture, is an important feature of the present invention. This feature prevents having to spend design resources and time redesigning the core's test architecture each time the core is used inside a new IC. A core's scan distributor and scan collector test architecture can be viewed as plug and play as far as its reuse within an IC.

I claim:

1. An integrated circuit comprising:
   A. a semiconductor substrate;
   B. functional circuits formed on the substrate;
   C. bond pads formed on the substrate and connected to the functional circuits;
   D. parallel scan paths circuits formed on the substrate and connected to the functional circuits, each of the parallel scan path circuits having a serial input and a serial output;
   E. at least one scan distributor circuit having a serial input connected to a first bond pad and having parallel outputs, each parallel output being connected to an input of a parallel scan path circuit; and
   F. at least one scan collector circuit having a serial output connected to a second bond pad separate from the first bond pad ad having parallel inputs, each input being connected to an output of a respective parallel scan circuit connected to the at least one scan distributor circuit.

2. The integrated circuit of claim 1 in which the scan distributor circuit is a serial input, parallel output circuit and the scan collector circuit is a parallel input and serial output circuit.

3. The integrated circuit of claim 1 including a controller connected to bond pads and to the scan distributor circuit, the scan path circuits and the scan collector circuit.

4. The integrated circuit of claim 1 in which the scan distributor circuit includes a serial output and the scan collector circuit includes a serial input and including at least another scan distributor circuit having a serial input coupled to the serial output of the scan distributor by a multiplexer and including at least another scan collector circuit having a serial output coupled to the serial input of the scan collector by a demultiplexer.

5. An integrated circuit comprising:
   A. a semiconductor substrate;
   B. functional circuits formed on the substrate;
   C. bond pads formed on the substrate and connected to the functional circuits;
   D. a first group of parallel scan paths circuits formed on the substrate and connected to the functional circuits, each of the first group of parallel scan path circuits having a serial input and a serial output;
   E. a first scan distributor circuit having a serial input connected to a first bond pad, a serial output and parallel outputs, each parallel output being connected to an input of a parallel scan path circuit of the first group;

F. a first scan collector circuit having a serial output connected to a second bond pad separate from the first bond pad, a serial input and parallel inputs, each parallel input being connected to an output of a respective parallel scan circuit of the first group;

G. core circuits, separate from the functional circuits, formed on the substrate;

H. a second group of parallel scan paths circuits formed on the substrate and connected to the core circuits, each of the second group of parallel scan path circuits having a serial input and a serial output;

I. a second scan distributor circuit having a serial input coupled to the serial output of the first scan distributor and parallel outputs, each parallel output being connected to an input of a parallel scan path circuit of the second group; and J. a second scan collector circuit having a serial output coupled to the serial input of the first scan collector and parallel inputs, each parallel input being connected to an output of a respective parallel scan circuit of the second group.

6. The integrated circuit of claim 5 including a multiplexer selectively coupling the serial output of the first scan distributor circuit to the serial input of the second scan distributor circuit and a demultiplexer selectively coupling the serial output of the second scan collector to the serial input of the first scan collector circuit.

7. The integrated circuit of claim 1 in which the serial output of the first scan distributor circuit is connected to the serial input of the second scan distributor and the serial output of the second scan collector is connected to the serial input of the first scan collector.

8. The integrated circuit of claim 1 including plural scan distributor circuits connected in series to the first bond pad and plural scan distributor circuits connected in series to the second bond pad.

9. The integrated circuit of claim 1 including a third scan distributor circuit having a serial input and a third scan collector circuit having a serial output and multiplexer circuits selectively connecting the serial output of the first scan distributor to the serial inputs of the second and third scan distributors and selectively connecting the serial outputs of the second and third scan collectors to the serial input of the first scan collector.

10. A process of testing an integrated circuit comprising:

A. receiving test stimulus data on one bond pad on the integrated circuit;

B. distributing the received test stimulus data to plural parallel scan paths on the integrated circuit; and C. applying the test stimulus data in the parallel scan circuits to functional circuits on the integrated circuit.

11. The process of claim 10 in which the distributing includes performing a serial to parallel conversion.

12. A process of testing an integrated circuit comprising:

A. receiving test response data in parallel scan circuits from functional circuits on the integrated circuit;

B. collecting the received test response data from the parallel scan circuits; and C. applying the collected test response data to one bond pad on the integrated circuit.

13. The process of claim 12 in which in which the collecting includes performing a parallel to serial conversion.

14. An integrated circuit comprising;

A. a semiconductor substrate;

B. functional circuits formed on the substrate;

C. parallel scan path circuits formed on the substrate and connected to the functional circuits, each of the parallel scan path circuits having a serial input and serial output;

D. at least one scan distributor circuit having serial input for receiving test data and having parallel outputs, each parallel output being connected to an input of a parallel scan path circuit; and E. at least one scan collector circuit having a serial output for transmitting test data and having parallel inputs, each input being connected to an output of a respective parallel scan circuit connected to the at least one scan distributor circuit.

15. The integrated circuit of claim 14 in which the functional circuits include combinational logic.

* * * * *